United States Patent
Chou et al.

(10) Patent No.: US 10,173,297 B2
(45) Date of Patent: Jan. 8, 2019

(54) CHEMICAL MECHANICAL POLISHING CONDITIONER AND METHOD FOR MANUFACTURING SAME

(71) Applicant: Kinik Company Ltd., Taipei (TW)

(72) Inventors: Jui-Lin Chou, New Taipei (TW); Ting-Sheng Huang, New Taipei (TW); Hsin-Chun Wang, New Taipei (TW); Xue-Shen Su, New Taipei (TW)

(73) Assignee: KINIK COMPANY LTD., Taipei (TW)

( * ) Notice: Subject to any disclaimer, the term of this patent is extended or adjusted under 35 U.S.C. 154(b) by 92 days.

(21) Appl. No.: 15/584,687

(22) Filed: May 2, 2017

(65) Prior Publication Data

US 2018/0029192 A1 Feb. 1, 2018

(30) Foreign Application Priority Data

Aug. 1, 2016 (TW) .............................. 105124293 A

(51) Int. Cl.
*B24B 53/017* (2012.01)
*B24B 53/00* (2006.01)
*B24D 18/00* (2006.01)
*C08K 3/22* (2006.01)
*C08K 3/02* (2006.01)
*C30B 29/36* (2006.01)

(52) U.S. Cl.
CPC ........ *B24B 53/017* (2013.01); *B24D 18/0009* (2013.01); *C08K 3/02* (2013.01); *C08K 3/22* (2013.01); *C30B 29/36* (2013.01); *C08K 2003/026* (2013.01); *C08K 2003/2227* (2013.01); *C08K 2003/2255* (2013.01)

(58) Field of Classification Search
CPC .............................. B24B 53/00; B24B 53/017
USPC ..................................... 451/443, 444, 56, 72
See application file for complete search history.

(56) References Cited

U.S. PATENT DOCUMENTS

| 5,486,131 A | * | 1/1996 | Cesna | .................. B24B 53/017 |
| | | | | 451/159 |
| 5,683,289 A | * | 11/1997 | Hempel, Jr. | .......... B24B 53/017 |
| | | | | 451/443 |

(Continued)

FOREIGN PATENT DOCUMENTS

| TW | 575477 B | 2/2004 |
| TW | M275917 U | 9/2005 |

(Continued)

*Primary Examiner* — Robert Rose
(74) *Attorney, Agent, or Firm* — Muncy, Geissler, Olds & Lowe, P.C.

(57) ABSTRACT

A chemical mechanical polishing (abbreviated as CMP) conditioner comprises a bottom substrate, an intermediate substrate and a diamond film The intermediate substrate is provided on the bottom substrate. The intermediate substrate comprises a hollow portion, an annular portion surrounding the hollow portion, and at least one projecting ring projecting out of the annular portion away from the bottom substrate. The projecting ring comprises a plurality of bumps arranged to be spaced apart from each other along an annulus region. The bumps are extended in a radial direction of the intermediate substrate. The diamond film is provided on the intermediate substrate. The diamond film is allowed for conforming to the bumps, so as to form a plurality of abrasive projections.

23 Claims, 14 Drawing Sheets

(56) References Cited

U.S. PATENT DOCUMENTS

| | | | | |
|---|---|---|---|---|
| 5,885,137 | A | * | 3/1999 | Ploessl .................... B24B 37/04 451/443 |
| 6,159,087 | A | * | 12/2000 | Birang .................. B24B 53/017 451/526 |
| 6,508,697 | B1 | * | 1/2003 | Benner ................. B24B 53/017 451/285 |
| 6,939,208 | B2 | * | 9/2005 | Kamimura ............ B24B 29/005 257/E21.23 |

FOREIGN PATENT DOCUMENTS

| | | |
|---|---|---|
| TW | 200948533 A1 | 12/2009 |
| TW | M510214 U | 10/2015 |

* cited by examiner

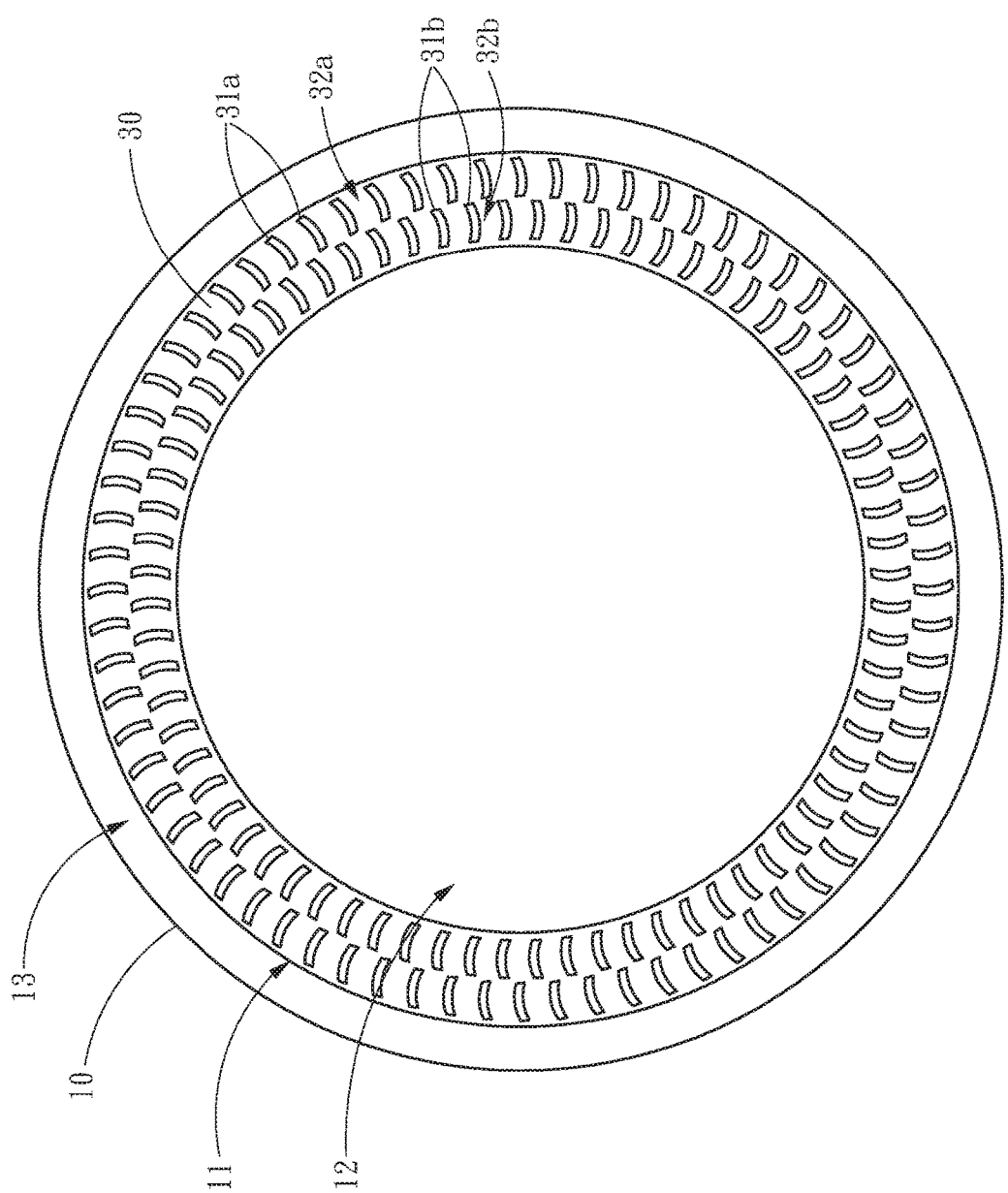

CHEMICAL MECHANICAL POLISHING CONDITIONER AND METHOD FOR MANUFACTURING SAME

FIELD OF THE INVENTION

The present invention is related to a chemical mechanical polishing (abbreviated as CMP) conditioner and method for manufacturing same, particularly to a CMP conditioner and method for manufacturing same with superior machining together with removing capability.

BACKGROUND OF THE INVENTION

In the semiconductor wafer fabrication process, a chemical mechanical polishing (abbreviated as CMP) process is widely used to polish the wafer so as to planarize the surface of the wafer. In a common CMP process, a polishing pad (or abrasive pad) fixed at a rotary table is used to contact with and apply a force to a silicon wafer carried on a spinning carrier. The carrier and the rotary table are rotated, while a polishing slurry is supplied to the polishing pad during polishing. In general, fragments derived by polishing and the polishing slurry are accumulated in pores of the polishing pad, such that the polishing pad is consumed and the polishing effect on wafer is then reduced. Therefore, it is necessary to use a conditioner for the removal of fragments and polishing slurry remained in the polishing pad.

In a conventional CMP conditioner using diamond particles as polishing material, such as that in Taiwan patent no. 575477 disclosing a CMP conditioner comprising a support member, and a plurality of hard abrasive grains provided on a surface of the support member, it is characterized in that the plurality of hard abrasive grains are regularly arranged on the surface of the support member, in which the hard abrasive grains are diamond particles. In another CMP conditioner using chemical vapor deposition (CVD) diamonds, such as that in Taiwan patent publication no. 200948533 proposing a non-planar CVD diamond-coated CMP pad conditioner and method for manufacturing same, it is primary to disclose a conditioning head comprising a chemical vapor deposited diamond composite, the conditioning head further comprising: (a) a non-coated substrate comprising a surface of substrate, the substrate further comprising: (1) a first phase comprising at least one ceramic material; and (2) a second phase comprising at least one carbide-forming material, in which the surface of substrate comprises at least one non-planar trimming region projecting out of the surface of substrate. Alternatively, in Taiwan utility model no. M275917 proposing a conditioner disk for use in chemical mechanical polishing, it is primary to disclose a conditioner disk for use on a polishing pad in chemical mechanical polishing process comprising a base structure and a plurality of blades, the base structure having an axial of rotation, the projecting blades being supported in a blade region by the base structure, each blade radiating outward from a central region of the base structure and extending tangentially, the blades extending in a common direction. Alternatively, in Taiwan utility model no. M510214, filed by the applicant, a chemical mechanical polishing conditioner comprising a substrate and multiple abrasive units is disclosed, the substrate having a top surface, the abrasive units being mounted on the substrate via a bonding layer. Each abrasive unit comprises a base of the abrasive unit and a polishing layer. The base of the abrasive unit is provided on a surface of the bonding layer opposite to the substrate. Moreover, considering the area of the top surface of the substrate as 100%, the area of the substrate covered by the base of the abrasive unit is in the range from 5% to 50%. The polishing layer is provided, on a surface of the base of the abrasive unit opposite to the bonding layer, with a plurality of tips.

In the above prior art, it is frequently prone to slice and clog the polishing pad, and further scratch wafers, due to the machining characteristic of diamond particles, in terms of chemical mechanical conditioner using diamond particles. Further, in terms of chemical mechanical conditioner using CVD diamonds, a base, a plurality of polishing substrates formed on the base, and CVD diamonds formed on the base of the abrasive units are in principle included in each case, as well as the CVD diamond is used as material for conditioning. In this case, with regard to the shape of the polishing substrate, the characteristic structure of the non-planar surface in Taiwan patent no. 200948533 may be presented in the form of linear or non-linear line segments, such as concentric rings, discontinuous or staggered concentric rings, spirals, discontinuous spirals, rectangles, discontinuous rectangles, irregular patterns, and etc., for example, discontinuous or continuous concentric rings together with spirals, or concentric rings together with spiral line segments. In Taiwan utility model no. M275917, the curved blades are extended in a radiating direction, while each blade is extended to the edge from a central region. In Taiwan utility model no. M510214, the base of the abrasive unit may be shaped as a hexagon, an arc, or another geometry. In the above chemical mechanical conditioner using CVD diamonds, although the problem of slicing the polishing pad may be eliminated, the impurities of chips are impossibly removed effectively. It is known from the above that the structure design of the chemical mechanical conditioner is still to be improved.

SUMMARY OF THE INVENTION

It is the main object of the present invention to solve the problem of being prone to slice and clog the polishing pad and thus scratch wafers in case of the conventional CMP conditioner using diamond particles, and the problem of incapability of removing impurities or chips effectively in case of the conventional CMP conditioner using CVD diamonds.

For achieving the above object, the present invention provides a CMP conditioner, comprising a bottom substrate, an intermediate substrate and a diamond film. The intermediate substrate is provided on the bottom substrate. The intermediate substrate comprises a hollow portion, an annular portion surrounding the hollow portion, and at least one projecting ring projecting out of the annular portion away from the bottom substrate. The projecting ring comprises a plurality of bumps arranged to be spaced apart from each other along an annulus region. The bumps are extended in a radial direction of the intermediate substrate. The diamond film is provided on the intermediate substrate. The diamond film is allowed for conforming to the bumps, so as to form a plurality of the abrasive projections.

In one embodiment, the adjacent abrasive projections are spaced apart from each other at an interval, the interval being 1 to 5 times with respect to a width of the bump.

In one embodiment, the projecting ring is presented as an arc with respect to the radial direction of the intermediate substrate.

In one embodiment, the abrasive projection is provided with a rough top surface.

In one embodiment, the abrasive projection is provided with a flat top surface.

In one embodiment, the intermediate substrate is made of an electrically conductive material, the electrically conductive material being selected from the group consisting of molybdenum, tungsten, and tungsten carbide.

In one embodiment, the intermediate substrate is made of a non-electrically conductive material, the electrically non-conductive material being silicon or single crystal aluminum oxide.

In one embodiment, the material of the intermediate substrate is an electrically conductive silicon carbide or an electrically non-conductive silicon carbide.

In one embodiment, the CMP conditioner further comprises a bonding layer provided between the bottom substrate and the intermediate substrate.

In one embodiment, the number of the projecting rings is in the range from 2 to 20.

In one embodiment, the adjacent projecting rings are staggered with respect to each other.

In one embodiment, the bottom substrate is a planar substrate, the intermediate substrate being provided on the planar substrate.

In one embodiment, the bottom substrate is provided with an annular accommodating groove for accommodating the intermediate substrate.

In one embodiment, the intermediate substrate is a circular substrate.

In one embodiment, the circular substrate comprises a plurality of segments adjacent to each other.

In one embodiment, the CMP conditioner further comprises a plurality of abrasive units, each abrasive unit comprising a carrying post passingly provided through the bottom substrate, a abrasive particle provided on the carrying post, and an abrasive bonding layer provided between the carrying post and the abrasive particle.

In one embodiment, the abrasive units are located at a peripheral part of the bottom substrate.

In one embodiment, the abrasive units are located at a central part of the bottom substrate.

For achieving the above object, the present invention further provides a method for manufacturing CMP conditioner comprising the steps of:

step 1: providing an intermediate substrate, the intermediate substrate comprising a hollow portion, an annular portion surrounding the hollow portion, and at least one projecting ring projecting out of the annular portion, the projecting ring comprising a plurality of bumps arranged to be spaced apart from each other along an annulus region, the bumps extending in a radial direction of the intermediate substrate;

step 2: forming a diamond film on the intermediate substrate, the diamond film conforming to the bumps so as to form a plurality of abrasive projections; and step 3: fixing the intermediate substrate to a bottom substrate.

In one embodiment, the method for forming the intermediate substrate is die casting or an energy processing method.

In one embodiment, the intermediate substrate is fixed to the bottom substrate via a bonding layer.

In one embodiment, the intermediate substrate is fixed to the bottom substrate through braze welding.

In one embodiment, the intermediate substrate is fixed to the bottom substrate through mechanical combination.

In comparison with above prior art, such as Taiwan patent no. 575477, for example, the present invention is capable of conditioning the polishing pad through the abrasive projections formed of the diamond film instead of diamond particles, so as to mitigate the problem of slicing the polishing pad, and thus prevent wafers from being scratched. As compared to Taiwan patent publication no. 200948533, Taiwan utility model no. M275917 and Taiwan patent application no. 104208835, specific structure of abrasive projections is used in the present invention, so as to expel chips and impurities outward efficiently and equally in each direction, and thus, enable the conditioning performance to be stable. As a whole, therefore, a superior conditioning effect is provided. In addition, in manufacturing the CMP conditioner, the diamond film of annular projecting structure with regular undulance is formed firstly, and the intermediate substrate is then fixed to the bottom substrate at one time. Thus, a relatively simple manufacturing process is obtained for facilitating mass production with reduced manufacturing cost.

BRIEF DESCRIPTION OF THE DRAWINGS

FIG. 10 is a top diagram of a fifth embodiment of the present invention.

DETAILED DESCRIPTION OF THE PREFERRED EMBODIMENTS

The detailed description and technical content of the present invention will now be described in combination with drawings as follows.

Figure 1:
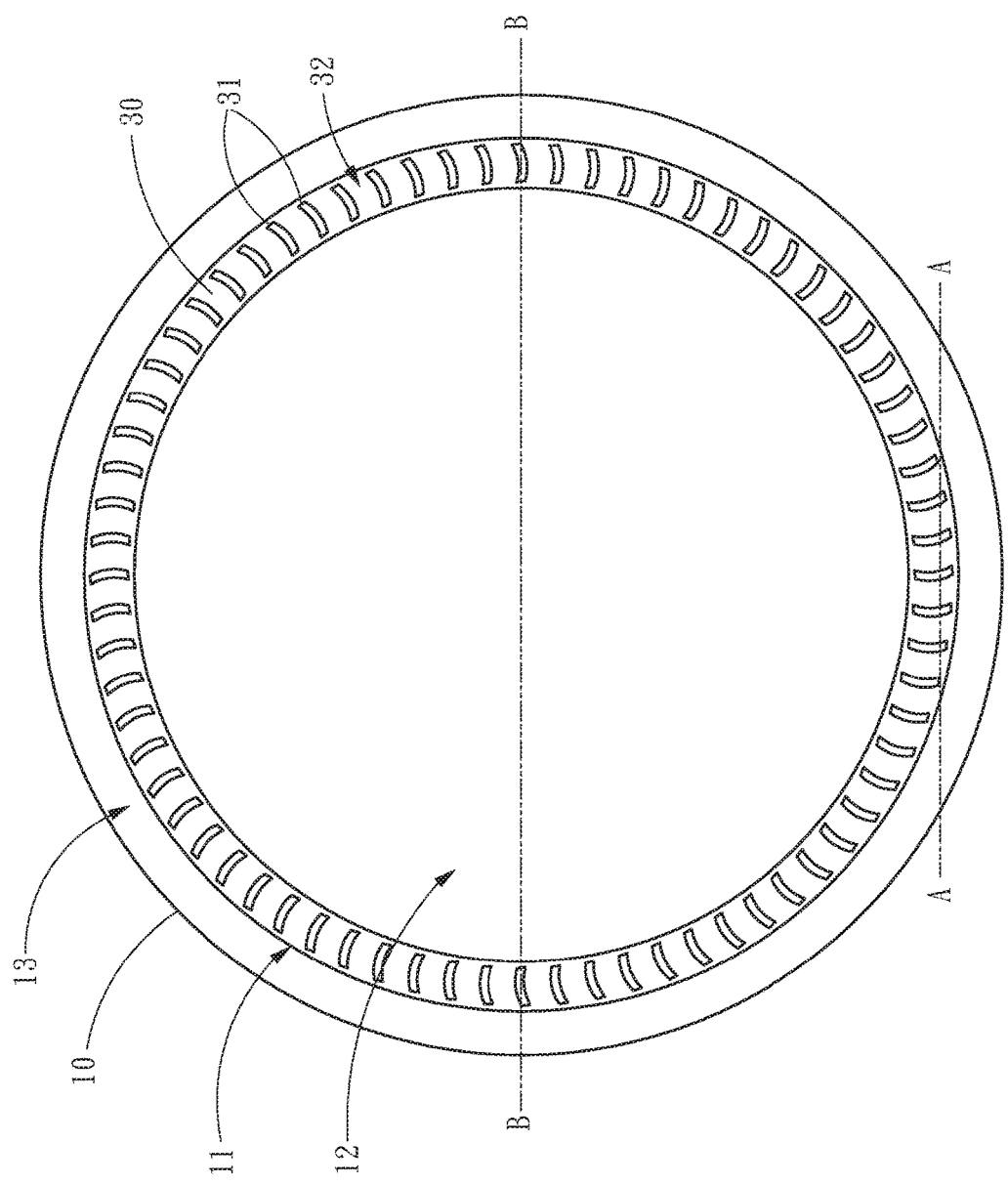
FIG. 1 is a top diagram of a first embodiment of the present invention.
Figure 2:
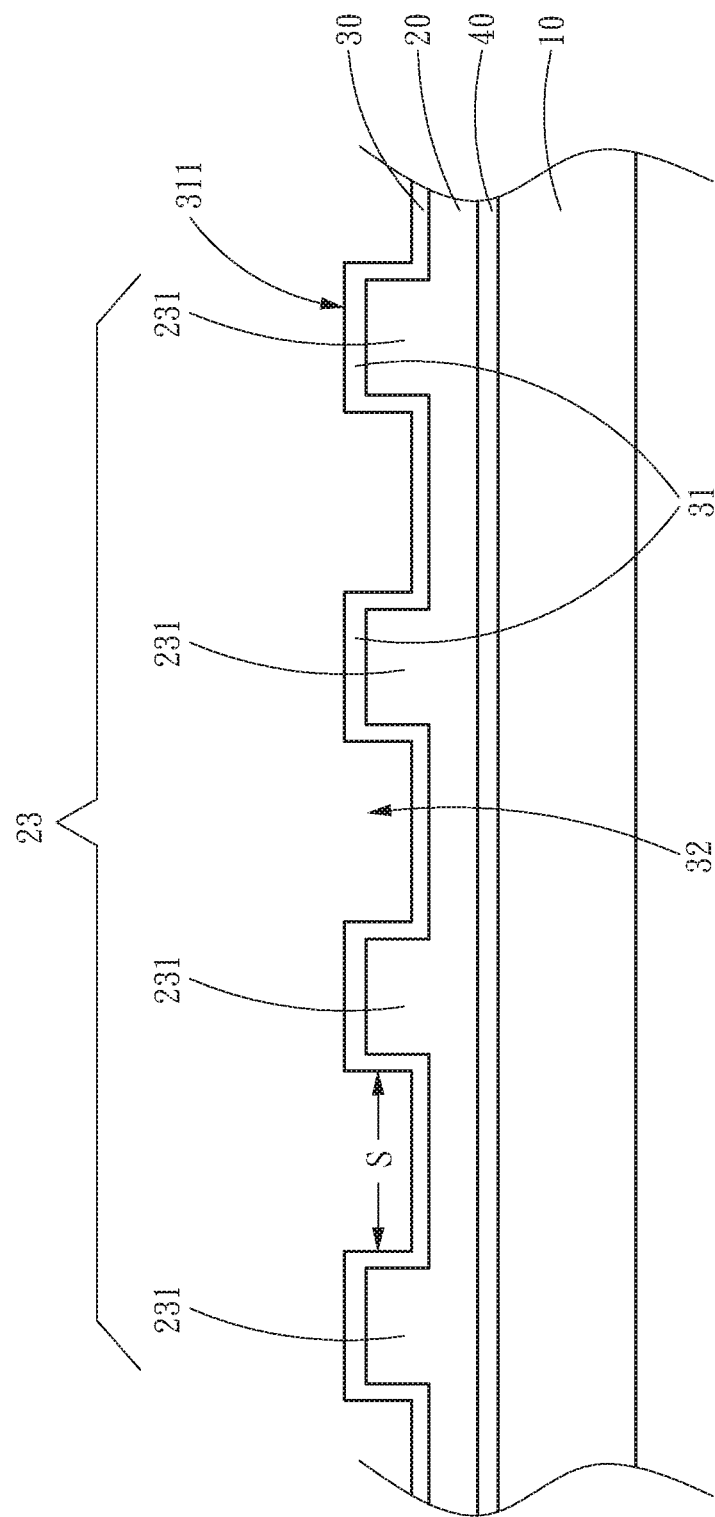
FIG. 2 is a cross-section diagram along A-A in FIG. 1.
Figure 3:
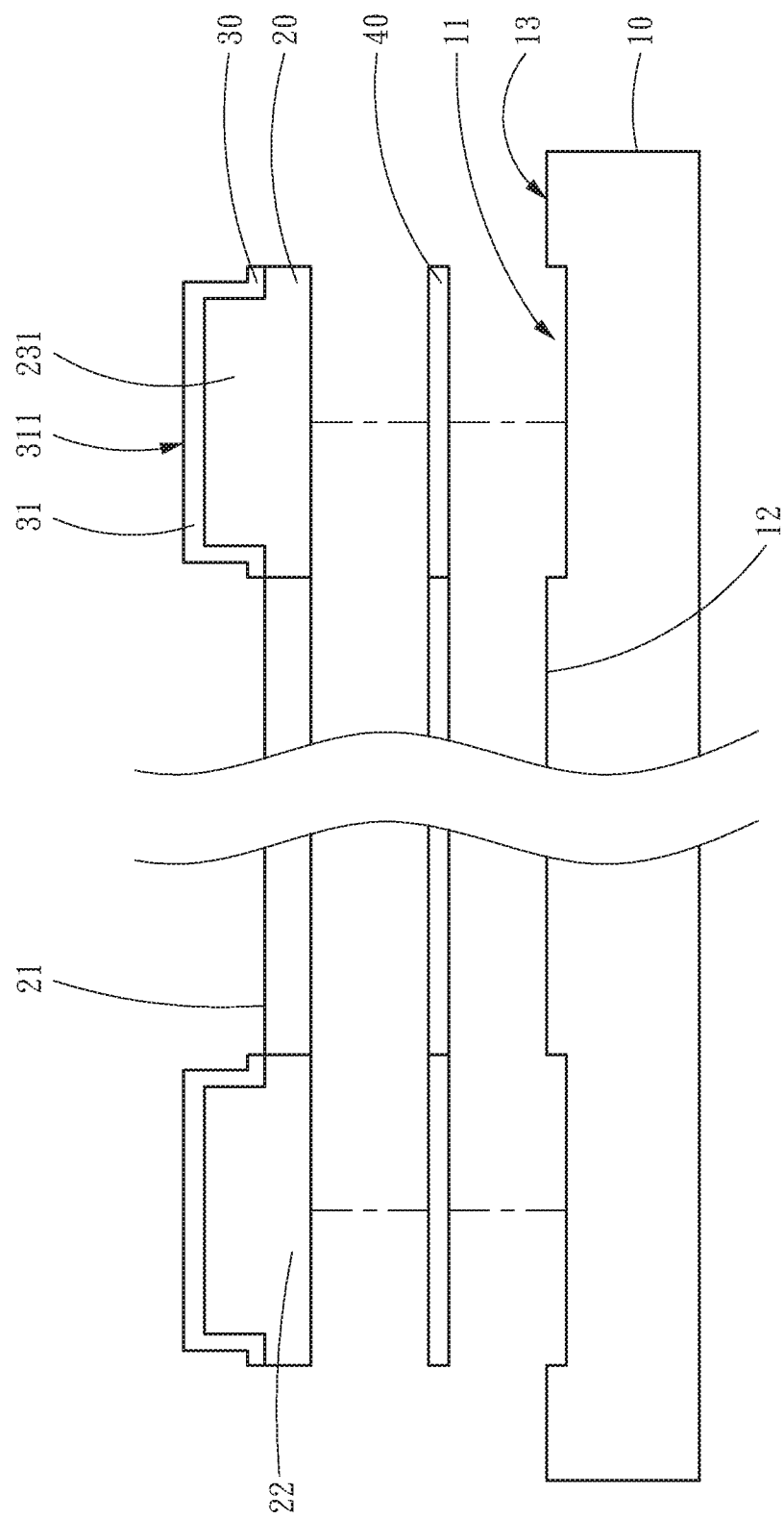
FIG. 3 is a side diagram along B-B in FIG. 1.

Referring to FIGS. 1, 2 and 3 together, there are shown a top diagram of a first embodiment of the present invention, a cross-section diagram along A-A in FIG. 1, and a side diagram along B-B in FIG. 1, respectively. The present invention is related to a CMP conditioner, comprising a bottom substrate 10, an intermediate substrate 20, a diamond film 30 and a bonding layer 40. The bottom substrate 10 comprises an annular accommodating groove 11, and a central part 12 surrounded by the annular accommodating groove 11. In one embodiment of the present invention, the material of the bottom substrate 10 is stainless steel, metal, plastics, ceramics and the combination thereof.

The intermediate substrate 20 is provided on the bottom substrate 10. In this embodiment, the intermediate substrate 20 is an integrally formed circular substrate in the form of a hollow annulus to be located inside the annular accommodating groove 11. In another embodiment, however, the intermediate substrate 20 may comprise a plurality of segments adjacent and pieced together to form the circular substrate. In this case, the depth of the annular accommodating groove 11 shown here is only exemplary, and may be also adjusted in accordance with the practical needs. In another embodiment, moreover, the bottom substrate 10 may be a planar substrate, i.e., no annular accommodating groove 11 is provided, while the intermediate substrate 20 is provided on a top surface of the bottom substrate 10. In addition, the material of the intermediate substrate 20 may be an electrically conductive silicon carbide or an electrically non-conductive silicon carbide.

In the first embodiment of the present invention, the intermediate substrate 20 comprises a hollow portion 21, an annular portion 22, and at least one projecting ring 23, the annular portion 22 surrounding the hollow portion 21. In the present invention, the number of the projecting rings 23 may be in the range from 1 to 20, and one ring is exemplified in this embodiment. The projecting ring 23 comprises a plurality of bumps 231 spaced apart from each other and arranged along an annulus region. In this case, the bumps 231 are projected out of the annular portion 22 away from the bottom substrate 10, and the bumps 231 are extended in a radial direction of the intermediate substrate 20. In the present invention, the radial direction is defined in a direction extended from a center of the intermediate substrate 20 toward an outer edge of the intermediate substrate 20. In this embodiment, the bump 231 is presented as an arc with respect to the radial direction of the intermediate substrate 20, while the arc of the bump 231 is directed in a counterclockwise direction. Moreover, the cross-section of the bump 231 is presented in the form of a rectangle, as illustrated in FIG. 2, but not limited thereto. In another embodiment, the bump 231 may be also presented in another geometry, such as trapezoid, for example. In this embodiment, the intermediate substrate 20 is provided on the bottom substrate 10 via the bonding layer 40. The bonding layer 40 is made of a material with adhesion, such as resin, and further, epoxy resin.

The diamond film 30 is allowed for cladding the intermediate substrate 20, and then conforming to the bumps 231, so as to form a plurality of abrasive projections 31. A chip removing channel 32 is formed between the abrasive projections 31. In other words, the diamond film 30 is therefore formed as an annular projecting structure with regular undulance. In this case, the abrasive projection 31 is also presented in the form of the arc, as illustrated in FIG. 1. In the present invention, the abrasive projection 31 comprises a top surface 311. The top surface 311 may be a rough top surface or a flat top surface. In addition, the abrasive projections 31 in the same annulus region are spaced apart from each other at an interval S. The interval S may be 1 to 5 times with respect to a width of the bump 231.

Figure 4:
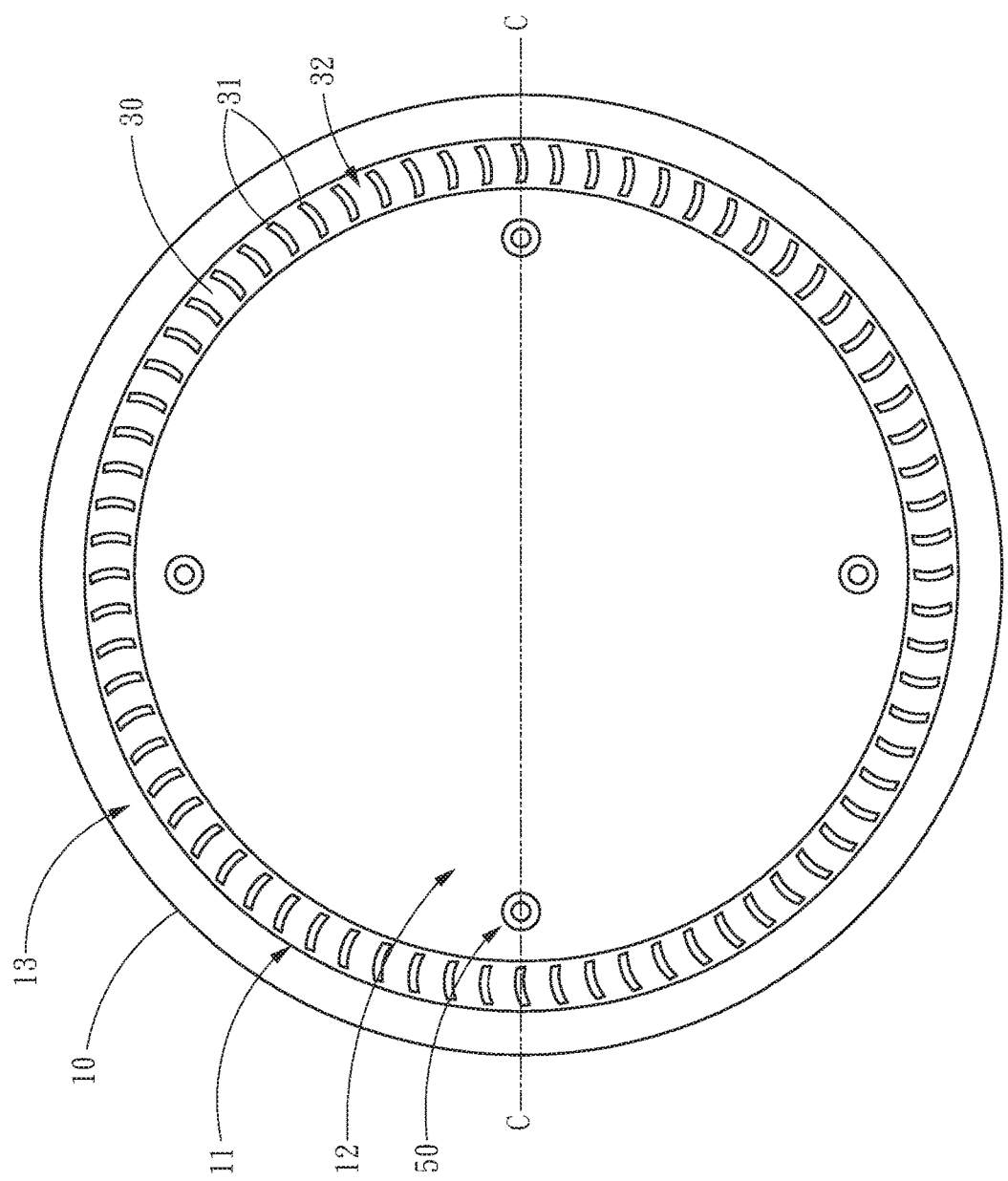
FIG. 4 is a top diagram of a second embodiment of the present invention.
Figure 5:
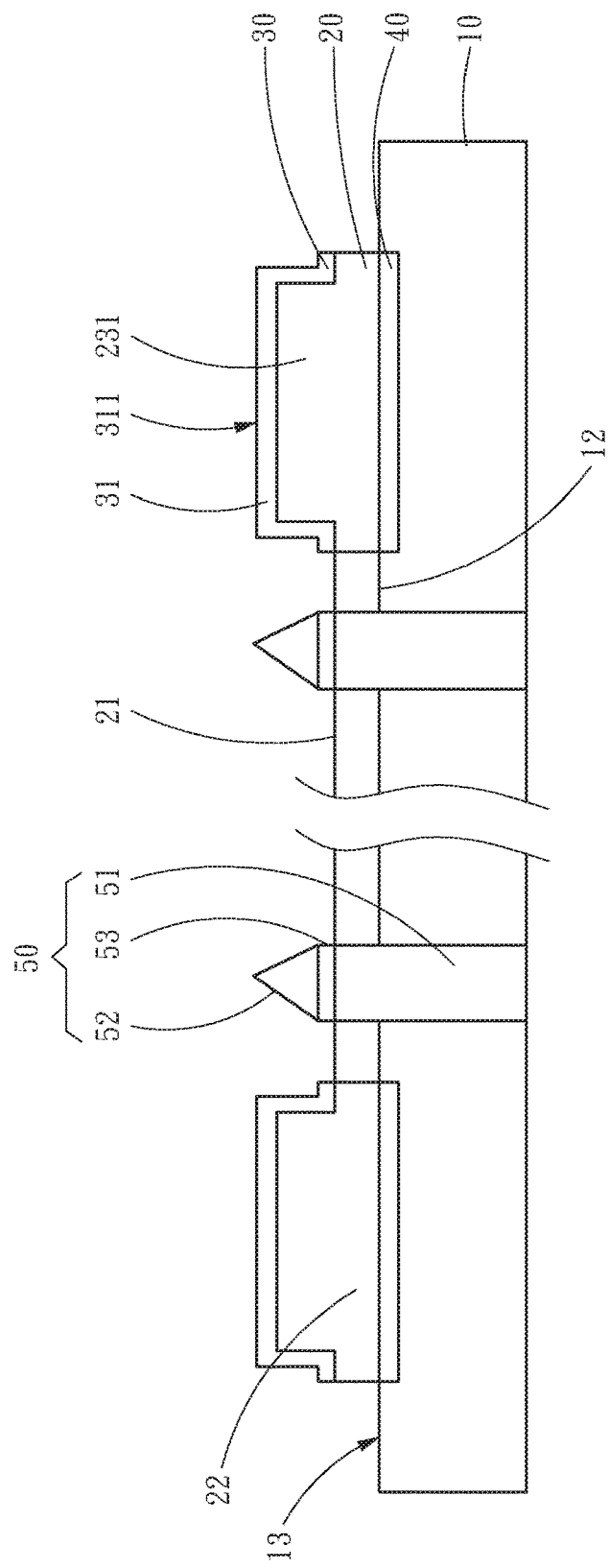
FIG. 5 is a cross-section diagram along C-C in FIG. 4.
Figure 6:
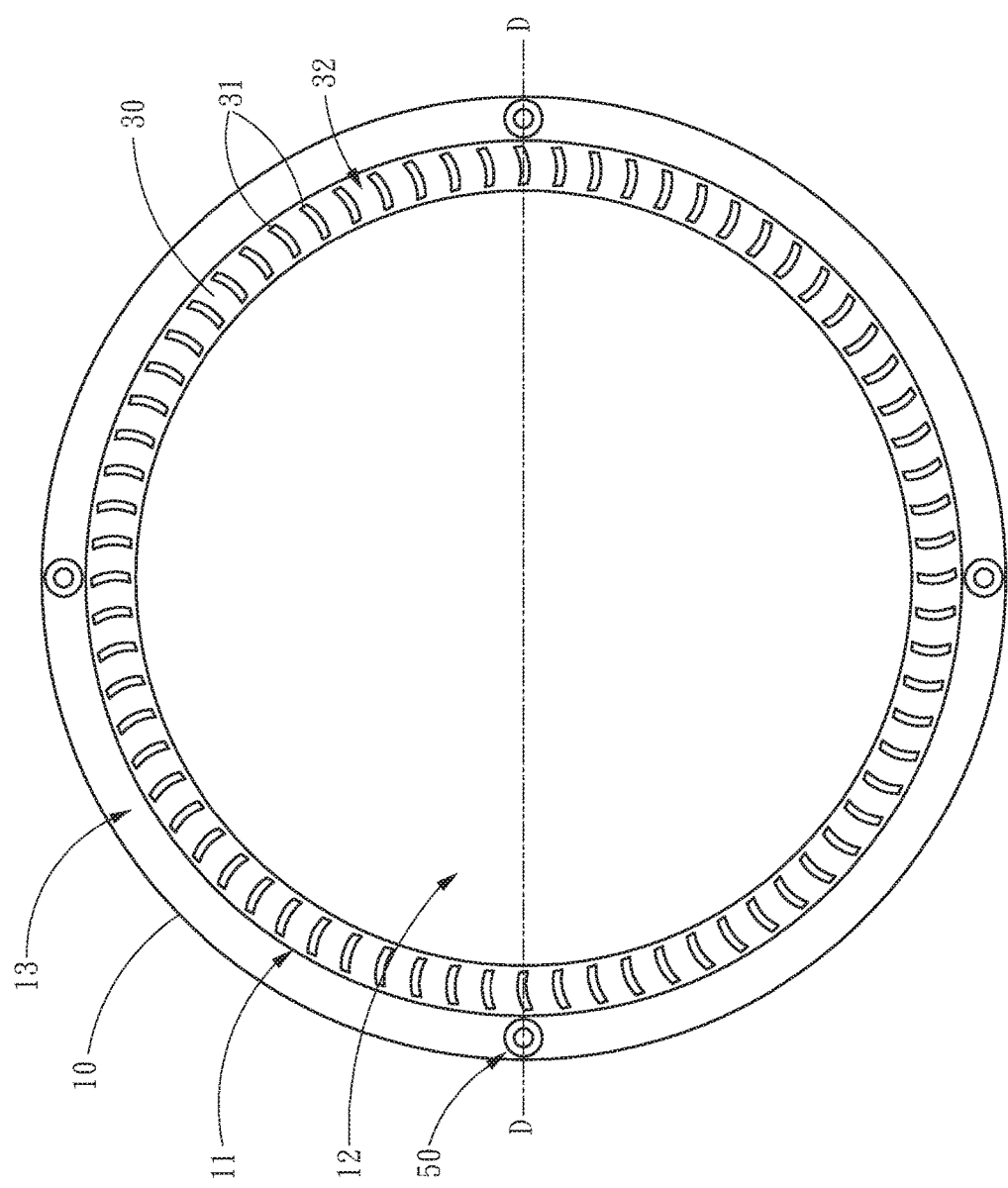
FIG. 6 is a top diagram of a third embodiment of the present invention.
Figure 7:
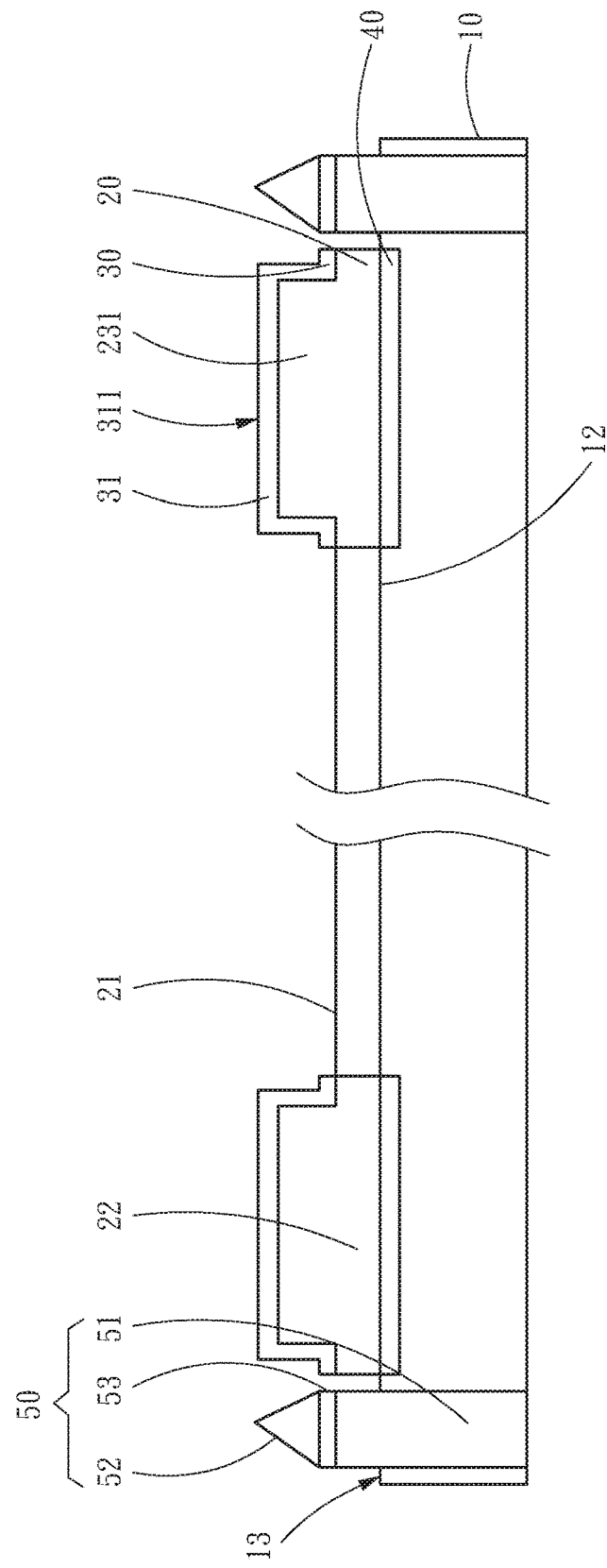
FIG. 7 is a cross-section diagram along D-D in FIG. 6.

Referring to FIGS. 4 and 5, there are shown a top diagram of a second embodiment of the present invention, and a cross-section diagram along line C-C in FIG. 4, respectively. In this case, the CMP conditioner further comprises a plurality of abrasive units 50, each abrasive unit 50 comprising a carrying post 51, a abrasive particle 52 and an abrasive bonding layer 53, respectively. The carrying post 51 is passingly provided through the bottom substrate 10. The abrasive particle 52 is provided on the carrying post 51. Further, the abrasive bonding layer 53 is provided between the carrying post 51 and the abrasive particle 52, such that the abrasive particle 52 is fixed on the carrying post 51. In this embodiment, the abrasive units 50 are located in the central part 12 of the bottom substrate 10. Referring to FIGS. 6 and 7, there are shown a top diagram of a third embodiment of the present invention, and a cross-section diagram along D-D in FIG. 6. The difference between this embodiment and the second embodiment is that the abrasive units 50 are located in a peripheral part 13 of the bottom substrate 10 in this embodiment.

Figure 8:
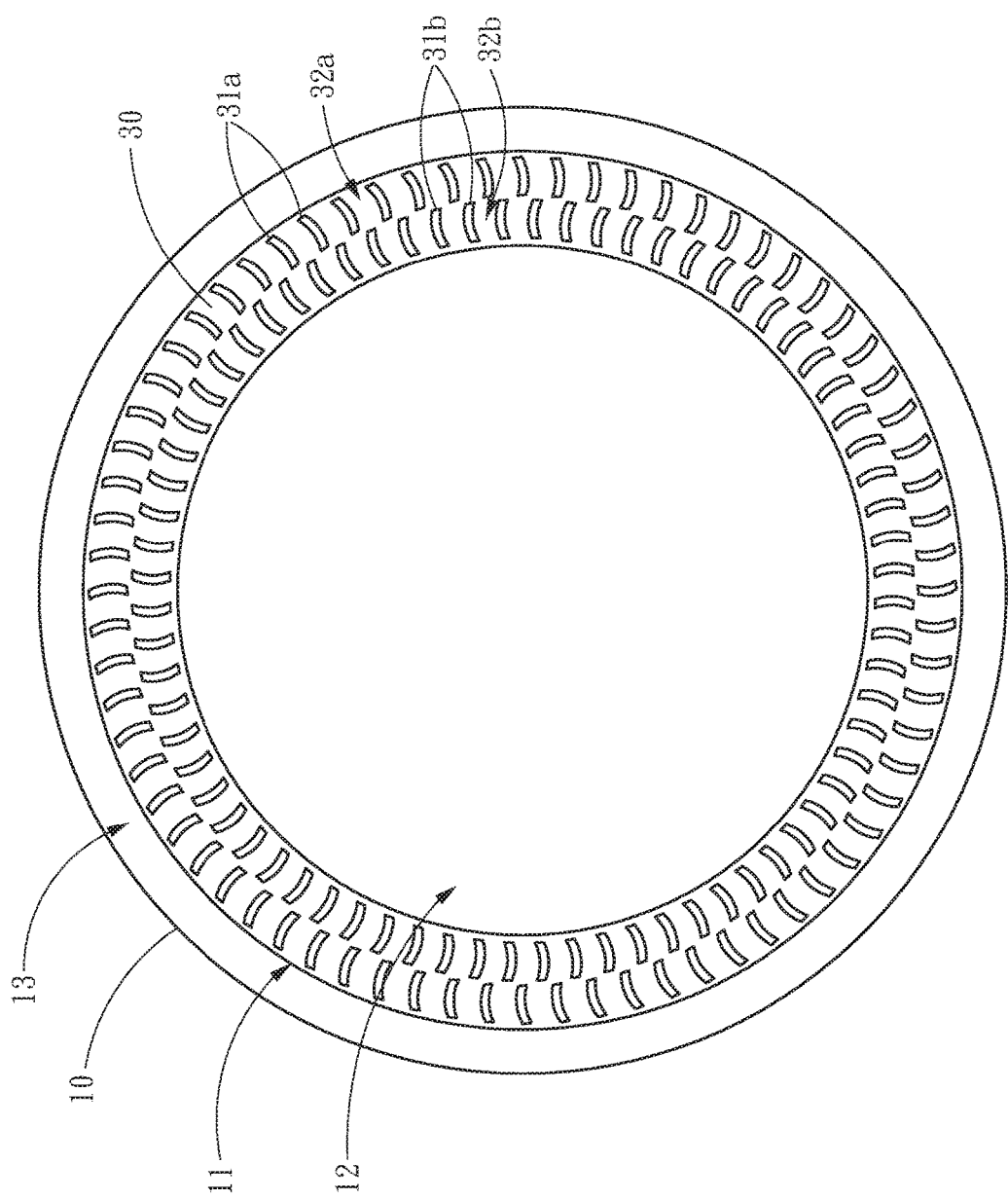
FIG. 8 is a top diagram of a fourth embodiment of the present invention.
Figure 9:
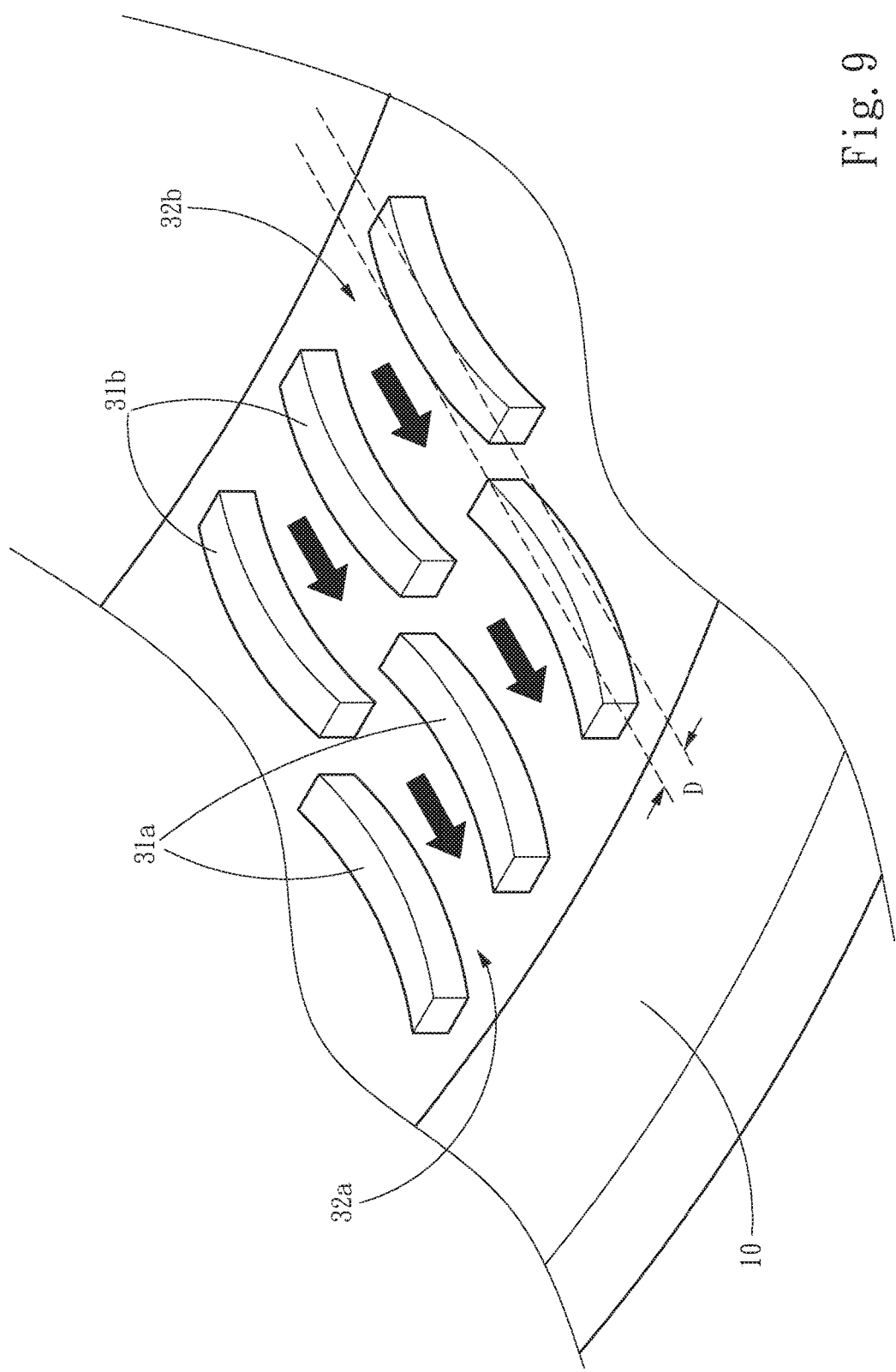
FIG. 9 is an operating diagram of the fourth embodiment of the present invention.

Subsequently, referring to FIGS. 8 and 9, there are shown a top diagram and an operating diagram of a fourth embodiment of the present invention, respectively. In this embodiment, two rings, exemplified for describing the projecting rings 23 (shown in FIG. 2), comprise a first projecting ring and a second projecting ring. Each of the first projecting ring and the second projecting ring comprises a plurality of first bumps and a plurality of second bumps spaced apart from each other. The diamond film 30 is allowed for cladding the intermediate substrate 20, and then forming a plurality of first abrasive projections 31a and a plurality of second abrasive projections 31b on the first bumps and the second bumps, correspondingly. Moreover, a plurality of first chip removing channels 32a and a plurality of second chip removing channels 32b are formed. Additionally, in the present embodiment, a dislocation D is formed between the first abrasive projections 31a and the second abrasive projections 31b, while the arc of the first abrasive projection 31a and that of the second abrasive projection 31b are directed in directions opposite to each other, in which the former is directed in a counterclockwise direction and the latter is directed in a clockwise direction. Referring to FIG. 9 further, this embodiment is exemplified for describing the chip removing mechanism of the CMP conditioner. An outward centrifugal force is generated in the CMP conditioner due to spin thereof on conditioning. At this moment, chips and impurities are driven by the centrifugal force to be expelled outward through the first chip removing channels 32a and the second chip removing channels 32b rapidly. Referring to FIG. 10 onward, there is shown a top diagram of a fifth embodiment of the present invention. The difference between this embodiment and the former embodiment is that the arcs of the first abrasive projection 31a and the second abrasive projection 31b are directed in the same direction in this embodiment.

The present invention further provides a method for manufacturing CMP conditioner corresponding to the above-mentioned CMP conditioner. Referring to FIGS. 11A to 14B, there are shown diagrams of a manufacturing process of one embodiment of the present invention. The method will be described as follows.

Figure 11A:
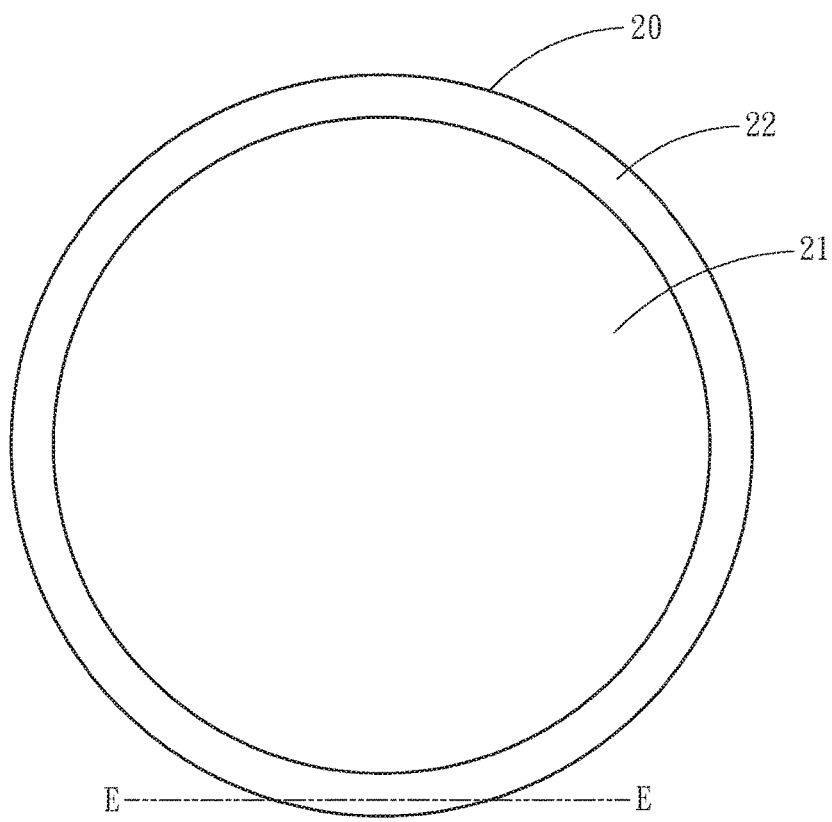
FIGS. 11A-B, 12A-B, 13A-B and 14A-B are diagrams of a manufacturing process of one embodiment of the present invention.
Figure 11B:
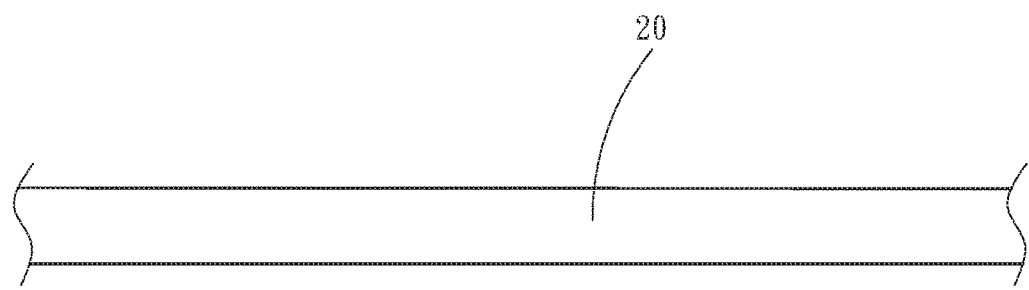
Figure 12A:
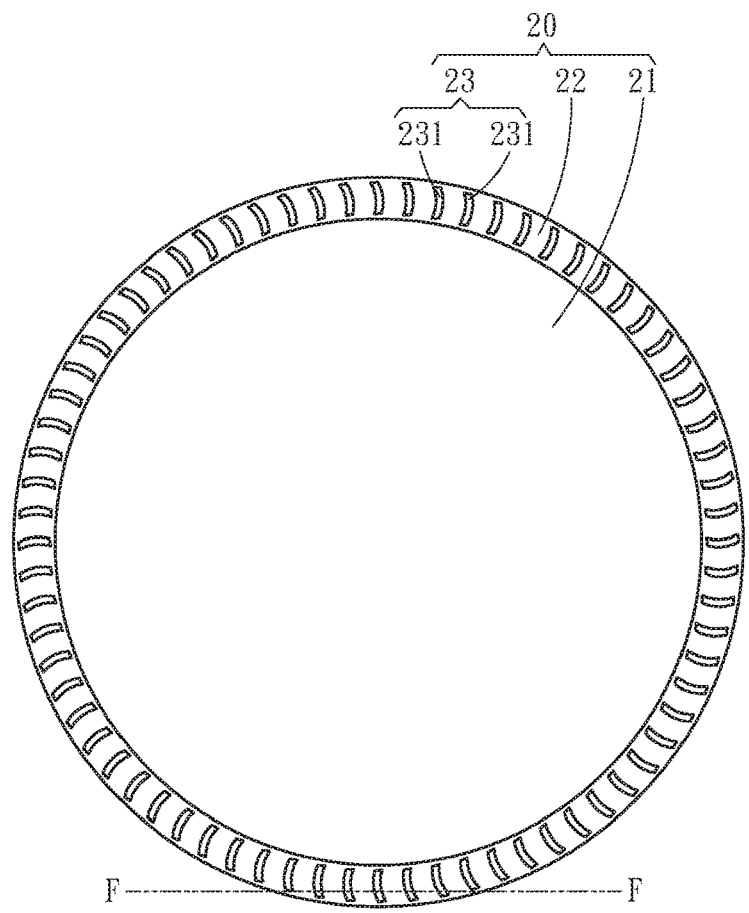
Figure 12B:
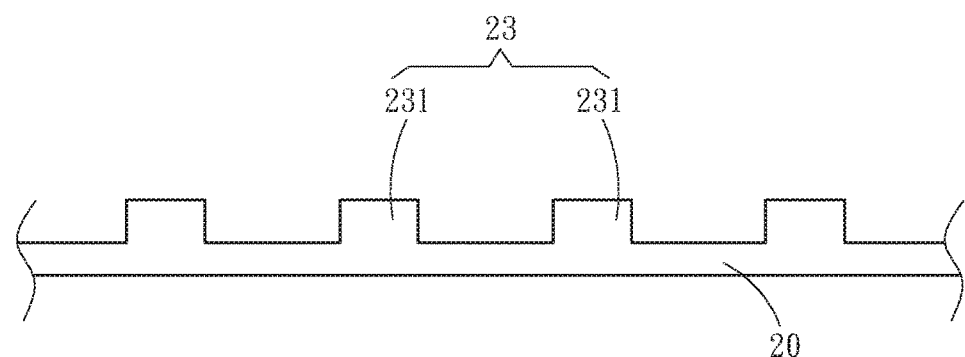

Firstly, providing an intermediate substrate 20, as illustrated in FIGS. 11A and 11B, FIG. 11B being a cross-section diagram along E-E in FIG. 11A, is performed. The intermediate substrate 20 comprises a hollow portion 21, and an annular portion 22 surrounding the hollow portion 21. Subsequently, processing the intermediate substrate 20 through, for example, an energy processing method, is performed. The energy processing method may be electric discharge machining or laser beam machining, taken as examples. A suitable processing method may be selected depending on practical needs of a user. A part of the intermediate substrate 20 is removed, such that at least one projecting ring 23 is generated in the intermediate substrate 20. The projecting ring 23 comprises a plurality of bumps 231 spaced apart from each other and arranged along an annulus region. The bumps 231 are extended in a radial direction of the intermediate substrate 20, as illustrated in FIGS. 12A and 12B, FIG. 12B being a cross-section diagram along F-F in FIG. 12A. In the present invention, the intermediate substrate 20 may be made of an electrically conductive material or an electrically non-conductive material. The electrically conductive material may be molybdenum, tungsten, tungsten carbide or the combination thereof The electrically non-conductive material may be silicon or single crystal aluminum oxide. When the electrically conductive material is used, electric discharge machining may be used cooperatively. When the electrically non-conductive material is used, laser beam machining is used cooperatively. Moreover, in addition to forming the structure of the intermediate substrate 20 through above-mentioned method, die casting may be used to obtain the above-mentioned structure during formation directly by, for example, pressing powders into an expected shape to be further sintered.

Figure 13A:
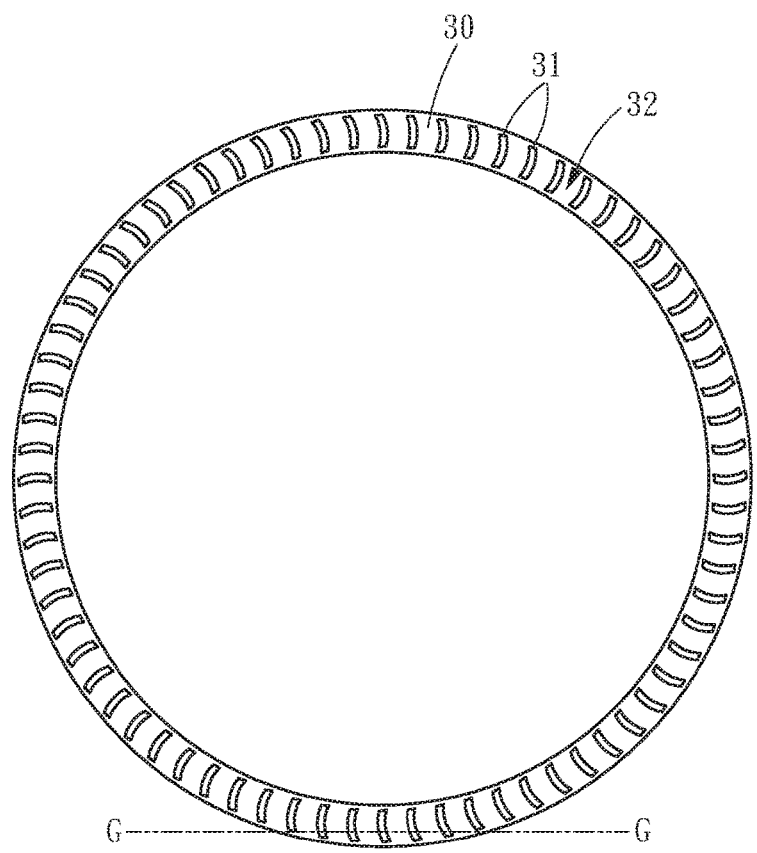
Figure 13B:
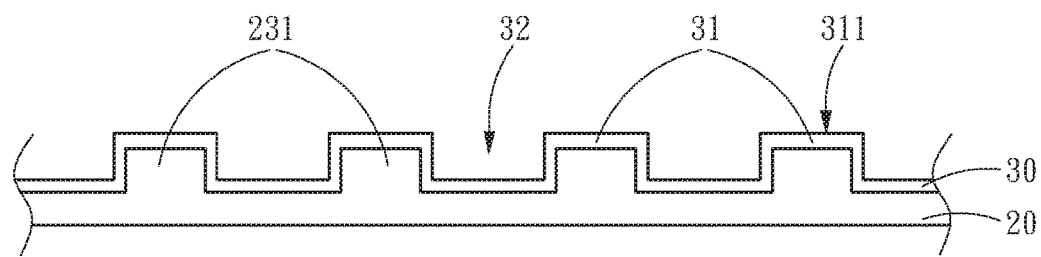
Figure 14A:
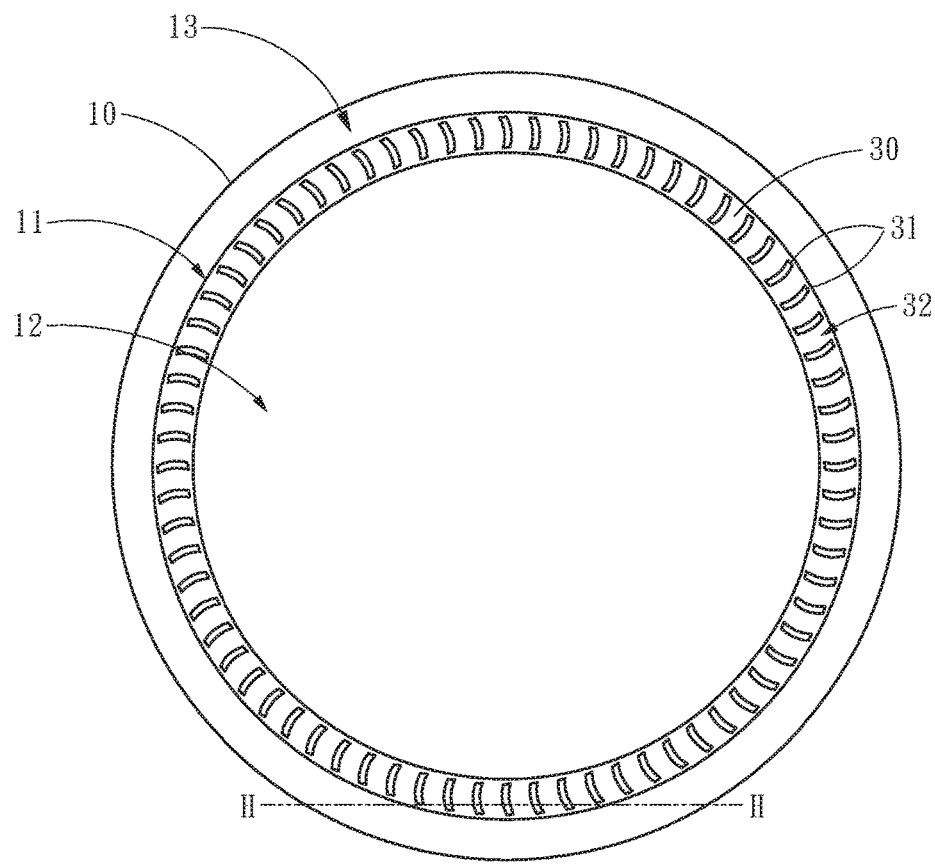
Figure 14B:
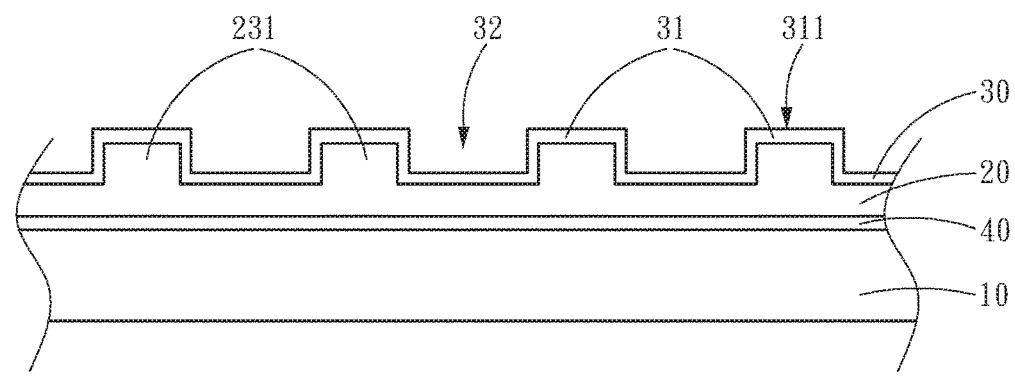

Referring to FIGS. 13A and 13B, FIG. 13B being a cross-section diagram along G-G in FIG. 13A. After the intermediate substrate 20 is formed, a diamond film 30 is clad on the intermediate substrate 20 and then allowed for conforming to the bumps 231, so as to form a plurality of the abrasive projections 31, while a chip removing channel 32 is formed between the abrasive projections 31. In the present invention, the diamond film 30 is a diamond thin film formed by chemical vapor deposition, such as filament CVD, plasma-enhanced CVD (PECVD), microwave plasma CVD (MPCVD), or the like. Then, a bonding layer 40 is utilized to fix the intermediate substrate 20 to the bottom substrate 10, as illustrated in FIGS. 14A and 14B, in which FIG. 14B is a cross-section diagram along H-H in FIG. 14A. In the present invention, the intermediate substrate 20 and the bottom substrate 10 may be also mutually fixed through braze welding or mechanical combination.

To sum up, the CMP conditioner of the present invention is capable of conditioning the polishing pad through the abrasive projections formed of the diamond film instead of diamond particles, so as to mitigate the problem of slicing the polishing pad, and thus prevent wafers from being scratched. Moreover, specific structure of abrasive projections is used in the CMP conditioner of the present invention, so as to expel chips and impurities outward efficiently and equally in each direction, and thus, enable the conditioning performance to be stable. As a whole, therefore, a superior conditioning effect is provided. In addition, in manufacturing the CMP conditioner, the diamond film of annular projecting structure with regular undulance is formed firstly, and the intermediate substrate is then fixed to the bottom substrate at one time. Thus, a relatively simple manufacturing process is obtained for facilitating mass production with reduced manufacturing cost.

What is claimed is:

1. A CMP conditioner, comprising:
   a bottom substrate;
   an intermediate substrate, provided on said bottom substrate, said intermediate substrate comprising a hollow portion, an annular portion surrounding said hollow portion, and at least one projecting ring projecting out of said annular portion away from said bottom substrate, said projecting ring comprising a plurality of bumps arranged to be spaced apart from each other along an annulus region, said bumps extending in a radial direction of said intermediate substrate; and
   a diamond film, provided on said intermediate substrate, said diamond film conforming to said bumps, so as to form a plurality of said abrasive projections.

2. The CMP conditioner according to claim 1, wherein said adjacent abrasive projections are spaced apart from each other at an interval, said interval being 1 to 5 times with respect to a width of said bump.

3. The CMP conditioner according to claim 1, wherein said projecting ring is presented as an arc with respect to said radial direction of said intermediate substrate.

4. The CMP conditioner according to claim 1, wherein said abrasive projection is provided with a rough top surface.

5. The CMP conditioner according to claim 1, wherein said abrasive projection is provided with a flat top surface.

6. The CMP conditioner according to claim 1, wherein said intermediate substrate is made of an electrically conductive material, said electrically conductive material being selected from the group consisting of molybdenum, tungsten, and tungsten carbide.

7. The CMP conditioner according to claim 1, wherein said intermediate substrate is made of a non-electrically conductive material, said electrically non-conductive material being silicon or single crystal aluminum oxide.

8. The CMP conditioner according to claim 1, wherein the material of said intermediate substrate is an electrically conductive silicon carbide or an electrically non-conductive silicon carbide.

9. The CMP conditioner according to claim 1, further comprising a bonding layer provided between said bottom substrate and said intermediate substrate.

10. The CMP conditioner according to claim 1, wherein the number of said projecting rings is in the range from 2 to 20.

11. The CMP conditioner according to claim 10, wherein said adjacent projecting rings are staggered with respect to each other.

12. The CMP conditioner according to claim 1, wherein said bottom substrate is a planar substrate, said intermediate substrate being provided on said planar substrate.

13. The CMP conditioner according to claim 1, wherein said bottom substrate is provided with an annular accommodating groove for accommodating said intermediate substrate.

14. The CMP conditioner according to claim 1, wherein said intermediate substrate is a circular substrate.

15. The CMP conditioner according to claim 14, wherein said circular substrate comprises a plurality of segments adjacent to each other.

16. The CMP conditioner according to claim 1, further comprising a plurality of abrasive units, each abrasive unit comprising a carrying post passingly provided through said bottom substrate, a abrasive particle provided on said carrying post, and an abrasive bonding layer provided between said carrying post and said abrasive particle.

17. The CMP conditioner according to claim 16, wherein said abrasive units are located at a peripheral part of said bottom substrate.

18. The CMP conditioner according to claim 16, wherein said abrasive units are located at a central part of said bottom substrate.

19. A method for manufacturing CMP conditioner comprising the steps of:
   step 1: providing an intermediate substrate, said intermediate substrate being provided with a surface, said intermediate substrate comprising a hollow portion, an annular portion surrounding said hollow portion, and at least one projecting ring projecting out of said annular portion, said projecting ring comprising a plurality of bumps arranged to be spaced apart from each other along an annulus region, said bumps extending in a radial direction of said intermediate substrate;
   step 2: forming a diamond film on said intermediate substrate, said diamond film conforming to said bumps so as to form a plurality of abrasive projections; and
   step 3: fixing a bottom surface of said intermediate substrate to a bottom substrate.

20. The method for manufacturing CMP conditioner according to claim 19, wherein the method for forming said intermediate substrate is die casting or an energy processing method.

21. The method for manufacturing CMP conditioner according to claim 19, wherein said intermediate substrate is fixed to said bottom substrate via a bonding layer.

22. The method for manufacturing CMP conditioner according to claim 19, wherein said intermediate substrate is fixed to said bottom substrate through braze welding.

23. The method for manufacturing CMP conditioner according to claim 19, wherein said intermediate substrate is fixed to said bottom substrate through mechanical combination.

\* \* \* \* \*